(12) United States Patent
Bore et al.

(10) Patent No.: US 7,737,774 B2
(45) Date of Patent: Jun. 15, 2010

(54) ELECTRONIC CIRCUIT WITH COMPENSATION OF INTRINSIC OFFSET OF DIFFERENTIAL PAIRS

(75) Inventors: François Bore, Revel (FR); Sandrine Bruel, Grenoble (FR)

(73) Assignee: E2V Semiconductors (FR)

( * ) Notice: Subject to any disclaimer, the term of this patent is extended or adjusted under 35 U.S.C. 154(b) by 29 days.

(21) Appl. No.: 12/097,722

(22) PCT Filed: Dec. 12, 2006

(86) PCT No.: PCT/EP2006/069583

§ 371 (c)(1),
(2), (4) Date: Oct. 29, 2008

(87) PCT Pub. No.: WO2007/068688

PCT Pub. Date: Jun. 21, 2007

(65) Prior Publication Data

US 2009/0224805 A1   Sep. 10, 2009

(51) Int. Cl.
*H03F 1/02* (2006.01)

(52) U.S. Cl. ............................................. 330/9; 327/65

(58) Field of Classification Search ......... 330/252–261, 330/9; 327/65, 124, 307
See application file for complete search history.

(56) References Cited

U.S. PATENT DOCUMENTS

| 3,434,069 A | 3/1969 | Jones |
| 6,114,906 A | 9/2000 | Fukui |
| 2001/0007443 A1 | 7/2001 | Ono |

*Primary Examiner*—Robert Pascal
*Assistant Examiner*—Hieu P Nguyen
(74) *Attorney, Agent, or Firm*—Lowe Hauptman Ham & Berner, LLP

(57) ABSTRACT

The invention relates to analog integrated electronic circuits using differential pairs. The proposal is for a method of automatic correction of offset voltage. The inputs (V1, V2) of the differential circuit are short circuited during a calibration phase distinct from the normal usage phase. A capacitor is charged through the difference of the output currents of the branches of the differential pair in this phase. The voltage at the terminals of the capacitor is compared with at least one threshold. During the normal usage phase following the calibration phase, the result of the comparison is kept in memory. In the normal usage phase, a correction is applied depending on the result kept in memory to a current source of a follower stage upstream of the differential pair.

16 Claims, 4 Drawing Sheets

ELECTRONIC CIRCUIT WITH COMPENSATION OF INTRINSIC OFFSET OF DIFFERENTIAL PAIRS

CROSS-REFERENCE TO RELATED APPLICATIONS

The present Application is based on International Application No. PCT/EP2006/068688, filed on Dec. 12, 2006, which in turn corresponds to French Application No. 0512837 filed on Dec. 16, 2005, and priority is hereby claimed under 35 USC §119 based on these applications. Each of these applications are hereby incorporated by reference in their entirety into the present application.

FIELD OF THE INVENTION

The invention relates to analog integrated electronic circuits using differential pairs making it possible to convert a difference of two input voltages into a difference of two output currents.

BACKGROUND OF THE INVENTION

In a differential pair, the difference of output currents depends on the difference of input voltages, and if a null potential difference is applied between the inputs, for example by short circuiting the inputs, the difference of the output currents should be null.

The defects of matching the components that constitute the pair mean that the pair has an offset input voltage, more commonly called the offset voltage, that is not null; this offset voltage represents the intrinsic imbalance of the pair and is reflected by a difference of non-null output currents in the presence of a null input differential voltage. In practice, the offset voltage is the compensation voltage that needs to be applied between the inputs so that the difference of output currents is null.

A differential pair conventionally comprises two branches supplied by one and the same reference current source Io, each branch comprising a transistor and a charge. The input voltages are applied to the bases of the transistors, the emitters are connected to the common current source, and the collectors are connected to the charges. The current of the source is shared between the two branches depending on the difference of input voltages applied to the bases.

The differential pairs may be used individually or grouped into associations of pairs when the installations are more complex. For example, two pairs may share one and the same charge, the collector of a transistor of one pair being connected to the collector of a transistor of another pair. The pairs may be mounted in cascade, a current output of one pair being connected to a current output of another pair which itself has another current output connected to a third pair, and so on. Depending on the use of the differential pairs, it is possible to find different associations of pairs. The invention applies in general to all these uses.

Such differential pairs are used notably in analog-digital converters. They are used for example to constitute comparators, each comparator comprising a differential pair receiving as an input, on the one hand, a voltage to be converted, on the other hand a reference voltage; they are also used, still for converters, in folding circuits; a folding circuit comprises several folding cells each constituted of at least one differential pair, the current outputs of the cells being connected in cascade to one another in order to establish a voltage or an analog output current that varies in a bell or in a sinusoid depending on the input voltage to be converted; the different cells each receive the input voltage and a respective reference voltage.

In precision analog circuits using several differential pairs, it is realized that the lack of precision of operation (notably lack of precision of conversion in the converters) may result from the presence of non-null offset voltages; from a physical point of view, these offset voltages result above all from the fact that the emitter-base voltages of the various transistors of the pairs are not exactly identical even when identical currents pass through them.

Specifically, the technologies are not perfect and two transistors manufactured simultaneously, having at least theoretically the same emitter surfaces, and even placed side by side in an integrated circuit therefore having every chance of being identical, do not have strictly identical features. This results from an inevitable dispersion of manufacturing. In addition, not only do the two transistors of a pair generate an offset voltage in this pair, but, due to this very dispersion, the various differential pairs of an integrated circuit inevitably have offset voltages that are different from one another.

It has already been proposed to reduce this disadvantage by using differential pairs having larger transistors. They have less dispersion because their size is better controlled. But then, the capacitors are bigger and the circuits are therefore slower, which is not desirable in applications such as fast analog-digital converters. For the latter, it would be better to have smaller transistors in the differential pairs. In addition, the circuits are more bulky if the transistors are bigger, and they consume more current.

Individual calibration solutions have also been proposed a posteriori: a manufactured converter is tested and the conversion errors are stored in an EPROM memory of the integrated circuit to be used for the compensation of the errors during use. Laser adjustment solutions also exist, notably for individually adjusting the resistances present in the differential branches. This technique requires an individual test and an individual correction of each integrated circuit depending on the conversion errors noted. The method is therefore extremely costly industrially, each circuit having to be tested and corrected individually.

SUMMARY OF THE INVENTION

The object of the invention is to propose a solution reducing these disadvantages in order to offer a better compromise between the quality, the cost of the circuit and its consumption.

The invention proposes to incorporate in the circuit that comprises a differential pair or a group of associated pairs an automatic calibration circuit associated with this pair or with this group of pairs; during an automatic calibration phase distinct from the normal usage phase, this circuit examines the value of the differential output current produced by the pair in the presence of a null input differential voltage; it compares this values with at least one threshold, and, depending on the result, it keeps in memory and may or may not apply a correction to the input of the pair during the normal usage phase of the latter. The correction is applied to a follower stage placed upstream of an input of the differential pair, in the following manner: the correction is applied to a current source which passes through a transistor of the follower stage; the base-emitter voltage will vary depending on this current and this variation is transferred to the input of the differential pair whose offset is therefore partially or totally corrected.

The measurement of the differential current that results from the application of a null differential voltage to the input is preferably taken by applying successive pulses of charge and discharge currents to a capacitor during a series of timeslots during the calibration phase. The charge current is the current of one of the branches of the differential pair, the discharge current is the current of the other branch. At the end of n pulses, the capacitor is charged in proportion to the difference of current between the branches. There are preferably two symmetrical capacitors for reasons of technological construction of the capacitors.

In summary, the method for automatic correction of offset according to the invention, applied to a differential integrated circuit comprising at least one differential pair with upstream at least one follower stage having a transistor and a current source, comprises the following steps:

- cancelling the differential voltages on the inputs of the differential circuit during a calibration phase distinct from the normal usage phase,
- charging a capacitor through the difference of the output currents of the branches of the differential pair in this phase,
- comparing the voltage at the terminals of the capacitor with at least one threshold,
- during the normal usage phase following the calibration phase, keeping the result of the comparison in memory,
- applying to the current source (SC1) in the normal usage phase a correction depending on the result kept in memory.

The electronic integrated circuit with differential pairs according to the invention therefore comprises at least two inputs to receive two voltages, two current outputs applied to charges, and at least one pair of differential branches connected to these charges and, upstream of the differential pair, at least one follower stage comprising a transistor and a current source connected to the emitter of this transistor; the integrated circuit is characterized in that it comprises

- a sequencer to establish an offset voltage calibration phase and a phase of usage of the circuit after calibration,
- at least one capacitor associated with the differential pair,
- a set of commutators actuated by the sequencer to direct the output currents to the charges during the usage phase and in order, on the one hand, to apply a null differential voltage to the inputs and, on the other hand, to alternatively direct one and then the other of the output currents to the capacitor during the calibration phase, by alternating charge and discharge, during a series of timeslots supplied by the sequencer,
- a circuit for detecting voltage thresholds at the terminals of the capacitor, actuated by the sequencer at the end of the series of timeslots, this circuit supplying a status signal representing the overshooting or not overshooting of a threshold and the sign of the voltage at the terminals of the capacitors,
- a circuit for keeping the status signal at the output of the detection circuit, in order to keep, during the usage phase, a status value that was determined during the calibration phase,
- a circuit for modifying the current of the current source of the follower stage depending on the status value present at the output of the retention circuit.

If there are two capacitors instead of one, the circuit comprises commutators for charging during an alternation one of the capacitors by one of the output currents of the differential pair while the other is discharged by the other output current, after which, during the next alternation, it is the first capacitor that is discharged by the current of the second output while the second capacitor is charged by the current of the first output. The capacitors are then placed in series in order to add their charges and compare the total with the threshold.

Provision can be made for there to be several thresholds, in order to determine several possible corrections, or alternatively for there to be two (or more) successive cycles, a first cycle establishing a first current correction on the follower stage and a second cycle establishing an additional correction, without deleting the first correction.

The invention is most particularly applicable to differential pairs that are more sophisticated than a simple differential pair with two transistors, and notably to interleaved pairs comprising four differential branches sharing a common charge two by two. In particular, the invention is applicable to an analog-digital converter which comprises a signal folding stage comprising several folding cells themselves constituted by interleaved differential pairs with four branches.

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention. Accordingly, the drawings and description thereof are to be regarded as illustrative in nature, and not as restrictive.

BRIEF DESCRIPTION OF THE DRAWINGS

The present invention is illustrated by way of example, and not by limitation, in the figures of the accompanying drawings, wherein elements having the same reference numeral designations represent like elements throughout and wherein.

DETAILED DESCRIPTION OF THE INVENTION

The general principle of the invention will first be explained concerning a simple differential pair, before it is shown how it is possible to apply it to a group of associated differential pairs, notably a group of two interleaved differential pairs that form part of a signal folding cell designed for an analog-digital converter.

Figure 1:
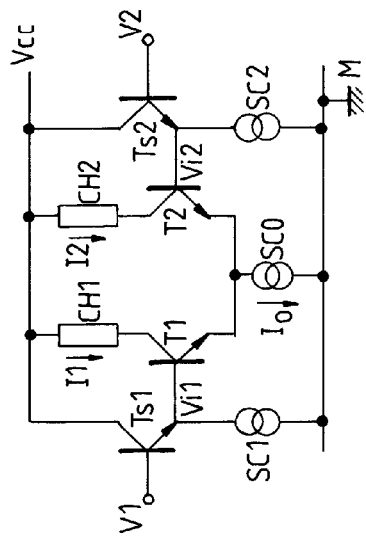
FIG. 1 represents a differential pair with follower stages upstream of the inputs.

The diagram of FIG. 1, shows the principle of a simple differential pair which comprises, upstream of each input of the actual pair, a voltage follower stage which controls this input. Such installations with a follower stage are extremely conventional, the follower stage having notably the role of bringing the input voltages applied to the pair to a desired common mode level.

The actual pair comprises two branches; each branch comprises a transistor, T1 for the first branch, T2 for the second branch, and a respective charge CH1, CH2. The input of the pair is constituted by the bases of the transistors T1 and T2; the outputs are constituted by currents 11, 12 in the charges.

The emitters of the transistors are connected to a constant current source SC0 supplying a current Io. The voltage on the base of T1 is Vi1, the voltage on the base of T2 is Vi2. The assembly is connected between a ground M and a supply voltage Vcc.

Upstream of the transistor bases are the follower stages. The follower stage that controls the voltage Vi1 comprises, in a simple configuration given as an example, a follower transistor Ts1, and a constant current source SC1 connected between the emitter of Ts1 and the ground; the collector of Ts1 is connected to Vcc. Similarly, the follower stage that controls the base of the transistor T2 of the other differential branch comprises a follower transistor Ts2 and a current source SC2 which are connected exactly like the first follower stage. The input voltages of the whole differential circuit (differential pair and follower stages) are voltages V1 and V2 applied to the bases of the follower transistors Ts1 and Ts2. The emitters of these transistors are connected to the bases of the transistors T1 and T2 of the differential pair. The difference between the input voltage V1 of the circuit and the input voltage Vi1 of the pair is the base-emitter voltage drop of the follower transistor TS1. It is determined by the current of the source SC1. The same applies for the V2-Vi1 voltage drop. The transistors T1 and T2 are identical; the transistors Ts1 and Ts2 are identical; the current sources SC1 and SC2 are identical. Only the technological dispersions affect this similarity.

Figure 2:
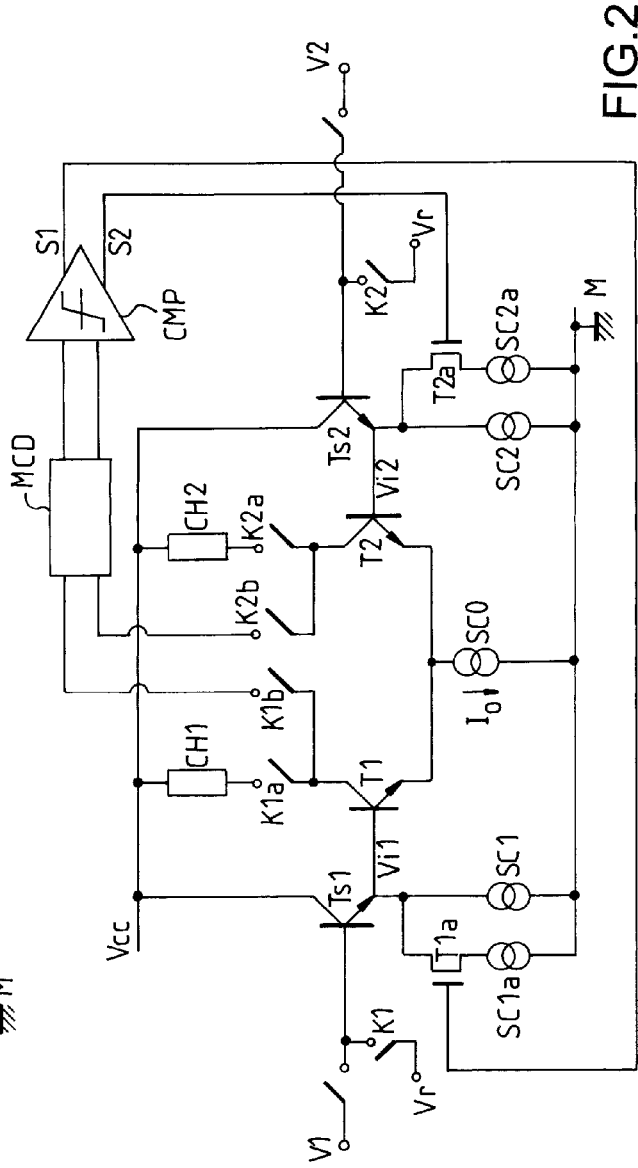
FIG. 2 represents the diagram of the invention applied to the pair of FIG. 1.

FIG. 2 represents the schematic diagram of the automatic offset correction proposed in this instance.

The correction uses an automatic calibration circuit that is activated during a calibration phase, separate from the normal usage phase. For example, the calibration phase is carried out automatically on each powering-up of the circuit. A sequencer not shown produces the logic signals necessary for the running of this phase. These logic signals notably control switches visible in FIG. 2.

First of all, the calibration circuit comprises switches that short circuit the inputs of the differential circuit during the calibration phase. For example, there is a switch K1 connecting the base of Ts1 to a fixed voltage reference Vr and a switch K2 connecting the base of Ts2 to the same voltage reference Vr, which is a way of short circuiting the inputs. During this time, the bases of the transistors Ts1 and Ts2 are isolated from the normal inputs of the differential circuit.

Then, there is a switch K1a and a switch K2a which isolate the collector of T1 or T2 from the respective charge CH1, CH2 during the calibration phase, and a switch K1b and a switch K2b that connect these collectors each to an input of a differential current measurement circuit MCD, the detail of which will be discussed below. This circuit produces a voltage value representative of the signed value of the differential current present when the differential input voltage is null. The output of the current measurement circuit MCD is applied to a comparison circuit CMP.

The comparison circuit CMP has two outputs S1 and S2; the voltages on these outputs are status signals representing an offset correction value to be applied to the differential pair to reduce or cancel out its offset voltage. In the version that is simplest, but sufficient in certain cases, the outputs are binary outputs having only two possible states and the comparison circuit is a comparator with threshold; no correction is applied if the threshold is not exceeded; a single correction value is applied if the threshold is exceeded, either by the output S1 or by the output S2 depending on the sign of the voltage produced at the output of the current measurement circuit MCD.

In more sophisticated versions, provision could be made for the comparison circuit to comprise a larger number of outputs in order to apply a more precise correction depending on the exceeding of several thresholds. This will be necessary for example for high resolution converters (12 bits for example).

A correction by a single value may suffice if the offset to be corrected is small by nature and if the precision of the converter is limited (8-bit converter for example). The diagram of FIG. 2 corresponds to this case: the output S1 is binary, it remains at zero if the measured differential current remains below the threshold, and it switches to 1 if the threshold is exceeded. The same applies for S2 but for an opposite differential current sign, therefore an opposite offset voltage sign.

The output S1 controls one of the follower stages, and the output S2 controls the other. This control comprises the addition of an additional constant current in parallel with the current of the source SC1 or SC2. The constant current is that of a low value auxiliary source SC1a (or respectively SC2a). The output S1 therefore controls the placing in conduction or the blocking of a transistor T1a in series with the source SC1a. The assembly of the source SC1a and of the transistor T1a is placed in parallel on the main source SC1 of the follower stage. The source SC1 is usually constituted by a transistor in series with a resistor. The assembly SC1a+T1a may be placed in parallel on the resistor (preferably) or on the assembly of the source SC1. The installation for the other follower stage is the same, with an auxiliary source SC2a and a control transistor T2a.

The comparator CMP is constituted so as to keep in memory, after the calibration phase, the status taken via the outputs S1 and S2 during the calibration phase. A retention circuit is therefore provided in the comparator or inserted between the comparator and the transistors T1a and T1b.

The correction of the offset results from modifying the base-emitter voltage drop of the follower transistor Ts1 or Ts2, which itself results from the passage of a larger emitter current in the transistor. If the differential current measured during the calibration phase exceeds the acceptable threshold, then an additional voltage drop on the follower transistor Ts1 or Ts2 is applied during the usage phases and it compensates for the offset that exists naturally in the pair.

It will be noted that the overall offset of the pair may result from matching defects of the transistors T1 and T2, or of the transistors Ts1 and Ts2 or of their current sources.

Figure 3:
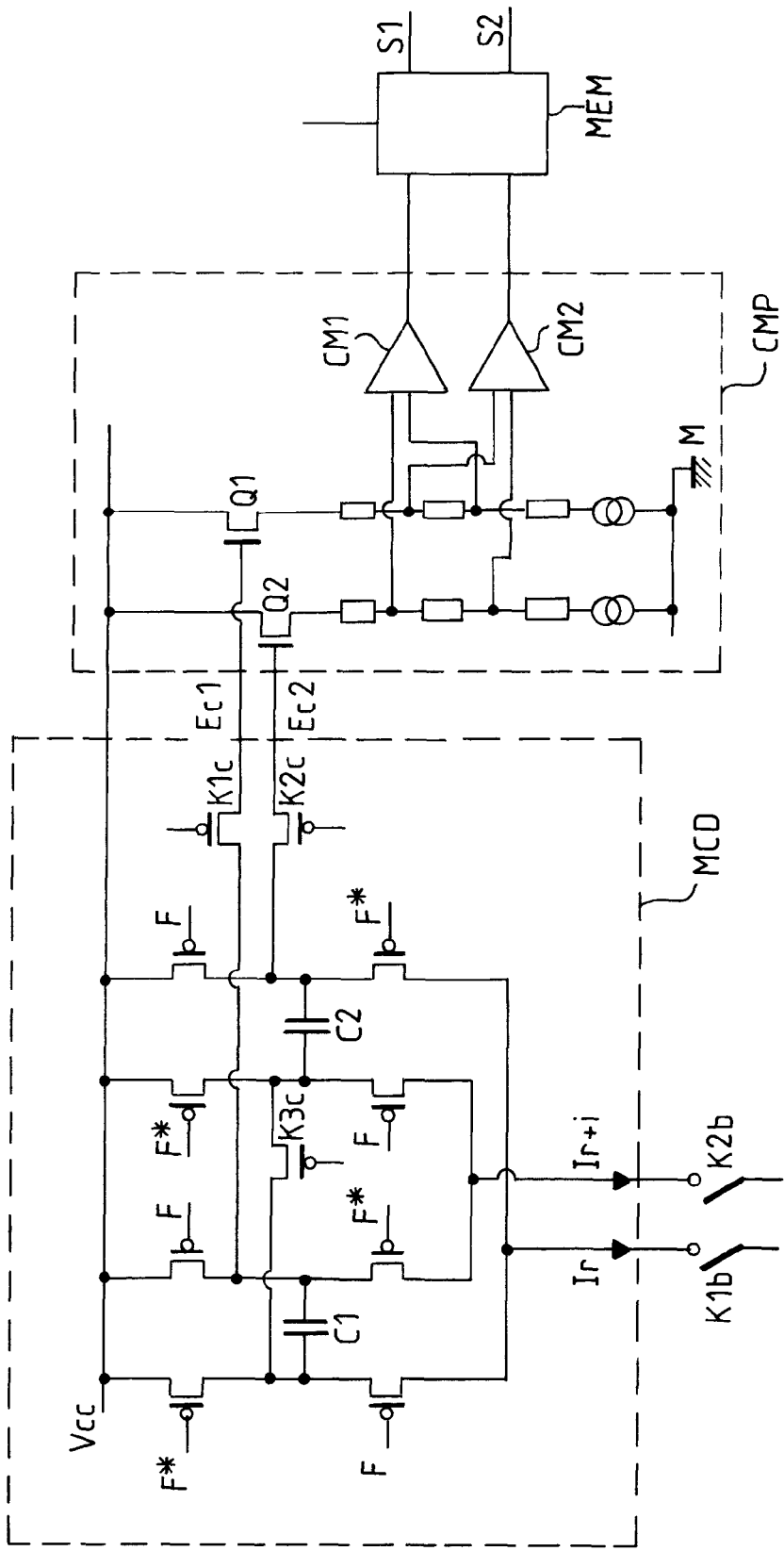
FIG. 3 represents the differential current measurement circuit and the associated threshold detector.

FIG. 3 represents the constitution of the assembly of the differential current measurement circuit MCD and of the comparison circuit CMP.

FIG. 3 shows the switches K1b and K2b by which the output currents of the differential pair may be brought to the circuit MCD during the calibration phase. These currents would in principle be equal if there was no offset. In the presence of an offset, it is considered that there is a current Ir on the output of the first differential branch and a current Ir+i on the second, where Ir=(Io−i)/2, the current i being the differential current that results from the offset and that will be measured.

The circuit MCD comprises two capacitors C1 and C2 into which the current i will be progressively inserted during the calibration phase. It will be noted that it is not obligatory to have two capacitors, only one would be sufficient, but the technology of the capacitors is such that it is preferable to have two of them and to discharge one while charging the other to prevent a dissymmetry induced by the technology for manufacturing the capacitors (typically, the bottom armature of the capacitor has a not inconsiderable interference capacity relative to the substrate unlike the top armature).

The first capacitor C1 is associated with four switches that are represented by MOS transistors.

The first capacitor C1 is associated with four commutators which are represented by MOS transistors. The capacitor C2 is associated with four other commutators. These commutators are actuated in alternation by two clock signals F and F* that are complementary and have the same duration T, and this occurs for n successive clock periods. During a timeslot F, certain commutators are open and others closed; during the next timeslot F*, it is the contrary. The commutators closed during the timeslot F cause a current to flow that can be called the charge current Ir+i originating from the switch K2a (second differential branch of the pair) in the capacitor C2, and a current that will be called the charge current Ir originating from the switch K1a (first branch) in the capacitor C1. During the following timeslot F*, the commutators are inverted and cause a discharge current Ir to flow (originating from the first branch) in the capacitor C2 and a discharge current Ir+i (second branch) in the capacitor C1.

The capacitors C1 and C2 take a charge (Ir+i).T and −Ir.T respectively if T is the duration of the timeslot F. The duration T is chosen to be sufficiently small so that the voltage at the terminals of the capacitors does not come close to the values that would saturate the transistors that carry the currents. During the following timeslot F*, the capacitor C2 loses a charge Ir.T and the capacitor C1 gains a charge (Ir+i).T At the end of a pair of consecutive timeslots F, F*, the capacitors C1 and C2 each have a charge i.T with opposite signs.

The capacitors C1 and C2 are in principle equal to a common value C. It will be noted that the matching of two capacitors may be much better (by a factor of 4 to 10) than the matching of resistors or of transistors in the same manufacturing process.

At the end of n periods of alternating charges and discharges F and F*, the charge in the capacitors is n.i.T. The number n of pairs of alternations is chosen to be sufficiently large (T being small) so that the voltage n.i.T/C at the terminals of the capacitors is much greater than the offset voltage that has given rise to this measurement and than the offset voltage of the comparison circuit, and so that it is easily comparable to a threshold in the comparison circuit CMP. The product n.T must be limited in order not to saturate the switches via the voltage n.i.T. The duration T may be approximately 2 nanoseconds, the capacity approximately 1 picofarad and the number n approximately 20, in order to obtain a charge voltage of approximately 100 mV for a current variance of 2.5 microamperes. A voltage of 100 millivolts can easily be compared with a threshold.

After n timeslots F and F*, the sequencer places the two capacitors in series to supply a voltage that is double the voltage at the terminals of each capacitor, and this voltage is applied to the comparison circuit CMP. Three switches K1c, K2c and K3c are rendered on-state in order to be used, on the one hand, for this placing in series and, on the other hand, for the connection of the sum voltage between the inputs of the circuit CMP.

In this example, the circuit CMP comprises two high input impedance follower stages which comprise two MOS transistors Q1 and Q2 (inputs Ec1 and Ec2 on the grilles) with a respective resistor bridge that is connected to the source of each of these transistors and that is supplied by a current source. The voltages applied to the grilles of the transistors are transferred to the sources and define the supply voltages of the resistor bridges. Two intermediate points of these bridges are connected to two comparators CM1, CM2 according to an installation such that the comparators are both in a first state if the voltage difference between their terminals is less than a threshold, the comparator CM1 toggles if the voltage difference, in a first direction, exceeds a threshold, the comparator CM2 toggles if the voltage difference, in an opposite direction, exceeds the same threshold; by construction, only the comparator concerned by the exceeding of the threshold can toggle.

A memory toggle MEM, connected to the outputs of the comparators CM1 and CM2, is actuated by the sequencer after the comparators have played their part, and it retains in memory, after the end of the calibration phase, the output state of the comparators; it supplies on its own outputs S1 and S2 the logic values representing this state. The outputs S1 and S2 control the auxiliary current sources SC1a, SC2a as explained with reference to FIG. 2.

It will be understood that a more sophisticated comparison could be made, a set of comparators supplying a larger number of outputs to control a larger number of auxiliary current sources, equal with one another or weighted with one another (in binary for example) on each follower stage upstream of the inputs of the differential pair.

Equally, it will be understood that it is possible to envision, still with a larger number of additional current sources on each follower stage, that the calibration phase is carried out on several occasions with only the two comparators of FIG. 3, provided however that the memory MEM has several couples of outputs S1a, S2a, S1b, S2b, etc. in order to store the status values taken by the comparators during each cycle and in order to control the larger number of auxiliary current sources. The sequencer of the calibration phase is then programmed to execute two successive cycles or more if there are more than two auxiliary current sources per follower stage:

cycle A: a measurement is taken at the end of a first series of n pairs of timeslots F and F*; this culminates in a first state of the comparators, stored in the memory in the form of values S1a and S2a. The memory retains these values for the rest of the calibration phase (in particular during the second cycle B) and subsequently during the phase of normal usage of the differential circuit; for all this time, the values S1a and S2a control the auxiliary current sources SC1a and SC2a;

cycle B: a second measurement is taken at the end of a second series of pairs of timeslots F and F*; this culminates in a new state of the comparators that may be different than the first state since this new measurement is taken while one of the auxiliary sources SC1a or SC2a is perhaps connected; the state of the outputs is stored in the form of values S1b, S2b in the memory MEM without losing the content of the values S1a, S2a. The stored values S1b, S2b control the supplementary auxiliary current sources SC1b, SC2b in parallel with the auxiliary sources SC1a and SC2a, and the correction of the second sources is added to the correction of the first ones. A weighting, for example binary, may be made between the two cycles, for example by giving the auxiliary sources SC1b, SC2b a current value that is half of that of the sources SC1a, SC2a and by doubling the number n of clock periods during the second cycle in order to be able to continue using the same thresholds in the comparator.

An application particular to an association of two differential pairs will now be described, this association constituting a folding cell of a folding circuit of an analog-digital converter. The folding circuit comprises several cells placed in cascade with one another. Each cell comprises two inputs to receive a differential voltage Vin-Vip to be converted, in the form of two voltages Vin, Vip (the same voltage Vin, Vip for all the cells), and two inputs to receive a reference differential voltage Vrefn-Vrefp in the form of two reference voltages Vrefn and Vrefp (different reference voltages for each cell of the folding circuit).

Figure 4:
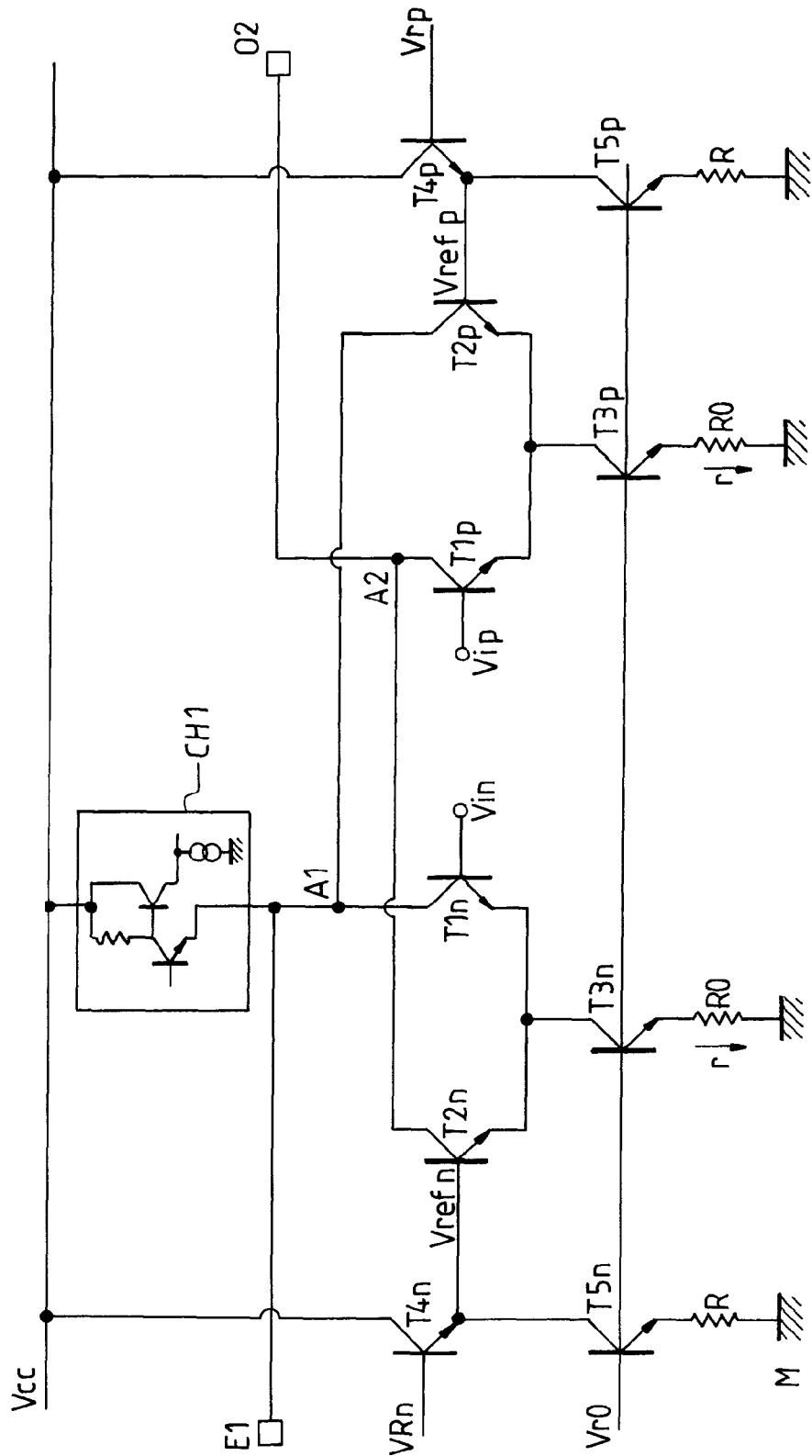
FIG. 4 represents a conventional constitution of a signal folding cell comprising an interleaved differential pair with four differential branches.

FIG. 4 represents a basic folding cell, which does not comprise the enhancement according to the invention. It comprises a first differential pair (transistors T1n, T2n) respectively receiving as inputs Vin and Vrefn and a second pair (transistors T1p and T2p) receiving as inputs Vip and Vrefp.

A charge CH1 serves as a charge common to the branch T1n of the first pair, to the branch T2p of the second pair and also to two branches of a preceding cell not shown (connection of this preceding cell via a terminal E1 of the cell shown, E1 being connected to the charge CH1). A charge not shown, because it forms part of the following cell, is connected to a terminal O2 of the cell; it serves as a common charge for the branch T2n of the first pair, for the branch T1p of the second pair, and for two branches of the following cell.

The charge may conventionally be constituted by a cascade transistor and a follower transistor.

The current sources that supply the two transistors of each pair (the equivalent of the sources SC0 of FIG. 1) have been shown here in the form of transistors with emitter resistor, which corresponds to a conventional practical implementation: transistor T3n for the first pair and resistor of value R0, identical transistor T3p and resistor of the same value R0 for the second pair.

Also represented is a follower stage upstream of the base of the transistor T2n (input Vrefn) and an equivalent stage upstream of the base of the transistor T2p (input Vrefp); no follower stage has been shown upstream of the bases that receive Vin and Vip, although such stages are usually provided (these stages are common to all the cells of the folding circuit that receive the same voltages Vin and Vip). The follower stage upstream of the first differential pair comprises a follower transistor T4n and a current source (transistor T5n and emitter resistor of value R). The follower stage upstream of the second pair comprises a follower transistor T4p with current source constituted by a transistor T5p and an emitter resistor of the same value R.

The inputs of the differential circuit thus constituted are therefore on the one hand the voltages Vin and Vip (or follower stage inputs upstream of these voltages) and on the other hand the voltages VRn and VRp on the bases of the follower transistors T4n and T4p; the input voltages VRn and VRp are transferred, with a base-emitter voltage drop, to the emitters of the transistors T4n and T4p, emitters that are connected to the bases of T2n and T2p respectively.

A constant voltage Vr0 controls the bases of all the transistors that are used as current sources: T3n, T3p, T5n, T5p.

The embodiment thus described is the simplest possible; more complex embodiments may be provided, without this changing what has been said on the use of the invention in such cells. For more details on the constitution of the cells, reference will be made to the documents dealing conventionally with analog-digital converters with folding circuits.

Figure 5:
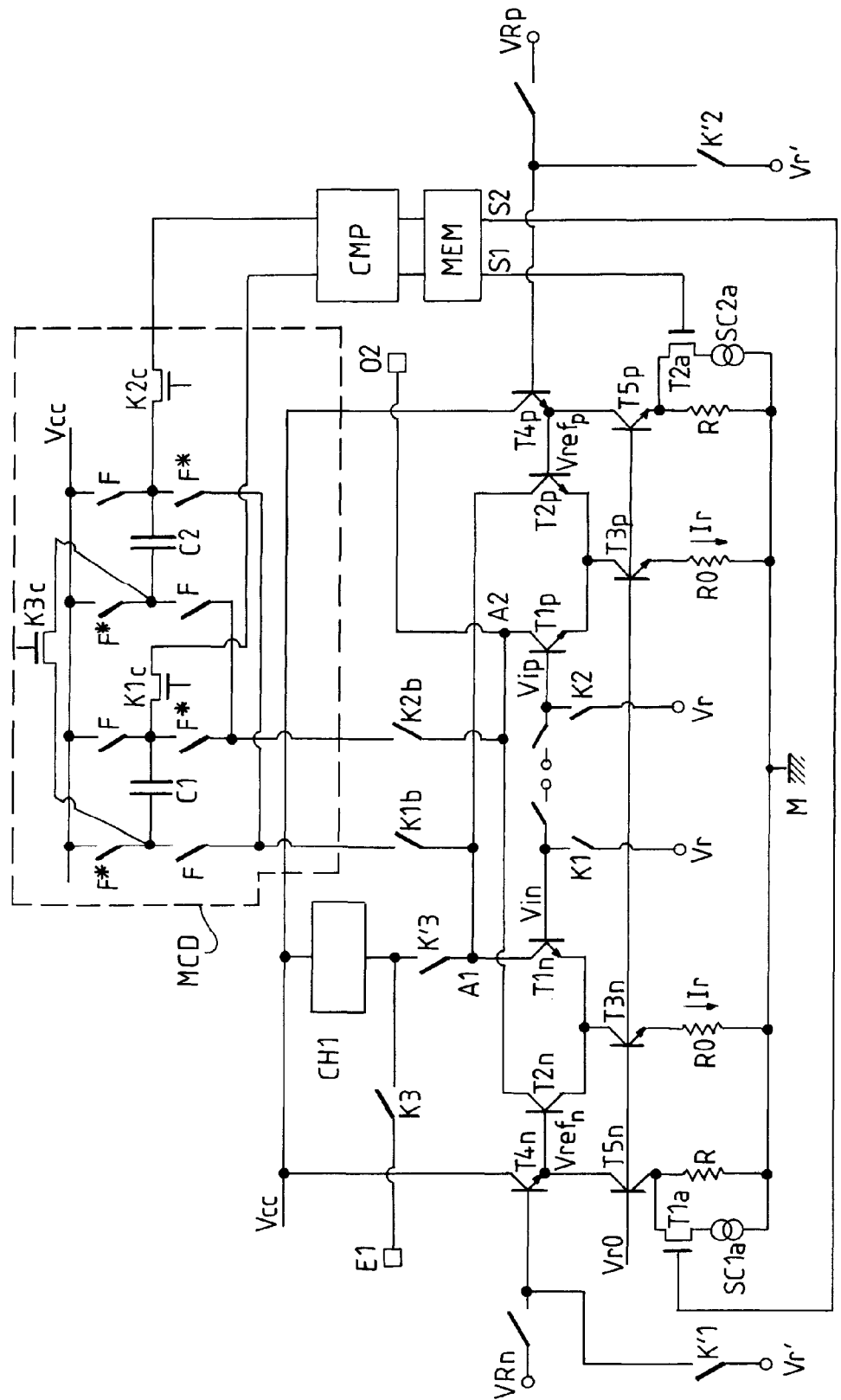
FIG. 5 represents the application of the principle of the invention to the cell of FIG. 4.

FIG. 5 shows how the cell of FIG. 4 can be modified to incorporate advantageously the principles of the present invention, by correcting the overall offset presented by the group of two interleaved differential pairs (sharing the same charges on their collectors), rather than the individual offset of each pair. It will now be seen how, in view of the offset correction, the difference of the two output currents of the cell will be measured, each output current in this instance being the sum of two output currents sampled in two pairs respectively.

Four switches K1 and K2, K'1 and K'2 make it possible to connect to two respective voltage references Vr and Vr', during the calibration phase, the inputs of the differential circuit so that the differential voltage seen between the bases of T1p and T2p on the one hand, and between T1n and T2n on the other hand, is null. If individual follower stages precede the inputs Vin and Vip, the switches must be placed on the bases of these followers and in this case the voltages Vr and Vr' may be identical (supposing that the followers are identical to those that precede Vrefn and Vrefp). This boils down to short circuiting together all the inputs of the interleaved pair during the calibration phase and in any case to applying null differential voltages to the input pairs of the interleaved differential pair.

An assembly of two switches K3 and K'3, open during the calibration phase, closed the rest of the time, makes it possible to
  disconnect the cell from the preceding cell during this calibration phase,
  disconnect the charge CH1 from the collectors of the differential pairs.

In FIG. 5, for example, K3 is connected between the terminal E1 and the charge CH1, and the switch K'3 is connected between the charge CH1 and the point A1 which joins the collectors of T1n and T2p.

A switch K1b connects the junction point A1 to a first input of the differential current measurement circuit MCD. Another switch K2b connects a second input of this circuit MCD to the junction point A2 which unites the collectors of the transistors T1p and T2n.

The switches K1b, K2b, K1 and K2, K'1 and K'2 are closed during the calibration phase, open the rest of the time.

The current measurement circuit MCD, whose inputs are connected to the switches K1b and K2b, may be strictly identical to that of FIG. 3, with two identical capacitors C1 and C2, commutators for directing the currents into the capacitors alternately originating from the switch K1b then from the switch K2b, so as to accumulate in the capacitors, during n pairs of timeslots F and F*, a voltage proportional to the difference of currents flowing in the two switches K1b and K2b, a difference that should be null in the absence of offset in the differential pairs.

The commutators K1c, K2c, K3c which make it possible to connect the capacitors C1 and C2 to the comparison circuit CMP are identical to those of FIG. 3. The comparison circuit CMP may be the same and has been represented in the form of a rectangle. The memory MEM at the output of the comparison circuit supplies two outputs S1 and S2 which control the auxiliary current sources that are added in parallel with the current sources T5n, R and T5p, R of the associated follower stages to the reference inputs VRn, VRp.

The auxiliary sources SC1a and SC2a are controlled by transistors T1a and T2a, as in FIG. 2, and the assembly in series of SC1a and T1a (or symmetrically SC2a and T2a) is in parallel on the emitter resistor R of the respective follower transistor.

The auxiliary current sources may be embodied by a MOS transistor having its base controlled by a constant voltage, this MOS transistor having a dimension chosen depending on the auxiliary current desired to make the correction.

The auxiliary current source may be simply a resistor if it is in parallel on the resistor R. It will be understood that this arrangement increases the current of the main current source, which is the equivalent of placing an auxiliary current source in parallel with the main current source. However, it is preferable for the auxiliary source to be constituted in the same manner as the main source in order to have the same variation depending on the temperature.

The choice of the value of auxiliary current is in practice dictated by the technology: for a given technology (and dimensions of transistors of given differential pairs), the expected dispersion of offset voltages is known, and it is possible to estimate what is the offset voltage increment that makes it possible to limit this dispersion to a narrower value. This offset voltage increment makes it possible, knowing the size of the transistor of the follower stage, to determine what is the auxiliary current increment that must be provided to at least partially compensate for an offset voltage that is too great.

It will be understood that in a folding cell in which the two differential pairs are tightly mixed, the output currents that have to be considered to measure a differential current due to an offset are not the individual currents of the two branches of a pair, but the output currents of the group of two interleaved differential pairs, that is to say of the sums of currents of the branches of the two pairs. It would be possible however to provide additional switches that separate the two interleaved pairs, in order to correct each pair individually, on condition that a separate measurement circuit for each pair and follower stages with auxiliary current sources on the two inputs of each pair are provided.

This correction would have no value unless individual followers preceded Vip and Vin. The collectors of T1$p$ and T2$n$ on the one hand, T1$n$ and T2$p$ on the other hand, being connected in normal operation, a self-calibration retaining these connections and considering all four transistors to be a single differential pair is sufficient and the compensation may be made only on one input Vrefn or Vrefp depending on the direction of the offset.

The foregoing description shows differential pairs with bipolar transistors, but the invention is applicable if the transistors are field effect transistors and it will be considered that the terms base, emitter and collector also cover the equivalent electrodes of source grid and drain of field effect transistors.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by definition contained in the appended claims and equivalents thereof.

The invention claimed is:

1. A method for automatically correcting offset voltage of a differential integrated circuit comprising a differential pair with, upstream of the pair, at least one follower stage having a transistor and a current source, comprising the following steps:
    cancelling the differential voltages on the inputs of the differential circuit during a calibration phase distinct from the normal usage phase,
    charging a capacitor through the difference of the output currents of the branches of the differential pair in this phase,
    comparing the voltage at the terminals of the capacitor with at least one threshold,
    during the normal usage phase following the calibration phase, keeping the result of the comparison in memory, and
    applying to the current source in the normal usage phase a correction depending on the result kept in memory.

2. The method as claimed in claim 1, wherein, during the calibration phase, first of all a current from a first branch of the differential pair then a current in the reverse direction from a second branch of the differential pair is applied to the capacitor.

3. The method as claimed in claim 2, wherein the charge and discharge is repeated n times to increase the voltage generated at the terminals of the capacitor by the difference of the output currents of the pair.

4. The method as claimed in claim 1, wherein the correction applied to the current source of the follower stage comprises paralleling with the current source of another current source of fixed value.

5. The method as claimed in claim 1, wherein two capacitors are provided and one of the capacitors is charged by one of the output currents while the other is charged by the other current then the capacitors are discharged by crossing the branches, the capacitors then being placed in series for the purpose of the comparison with the threshold.

6. An electronic integrated circuit with differential pairs comprising at least two inputs to receive two voltages, two current outputs applied to charges and at least one pair of differential branches connected to these charges and, upstream of the differential pair, at least one follower stage comprising a transistor and a current source connected to the emitter of this transistor, said circuit comprising:
    a sequencer to establish an offset voltage calibration phase and a phase of usage of the circuit after calibration,
    at least one capacitor associated with the differential pair,
    a set of commutators actuated by the sequencer to direct the output currents to the charges during the usage phase and in order, on the one hand, to apply a null differential voltage to the inputs and, on the other hand, to alternatively direct one and then the other of the output currents to the capacitor during the calibration phase, by alternating charge and discharge, during a series of timeslots supplied by the sequencer,
    a circuit for detecting voltage thresholds at the terminals of the capacitor, actuated by the sequencer at the end of the series of timeslots, this circuit supplying a status signal representing the overshooting or not overshooting of a threshold and the sign of the voltage at the terminals of the capacitors,
    a circuit for keeping the status signal at the output of the detection circuit, in order to keep, during the usage phase, a status value determined during the calibration phase,
    a circuit for modifying the current of the current source of the follower stage depending on the status value present at the output of the retention circuit.

7. The circuit as claimed in claim 6, comprising two identical capacitors, and commutators for charging during an alternation one of the capacitors by one of the output currents of the differential pair while the other is discharged by the other output current, after which, during the next alternation, it is the first capacitor that is discharged by the current of the second output while the second capacitor is charged by the current of the first output.

8. The integrated circuit as claimed in claim 6, wherein the differential pair is an interleaved pair comprising four differential branches sharing a common charge two by two.

9. The integrated circuit as claimed in claim 8, wherein the interleaved differential pair forms part of a folding cell of a folding circuit in an analog-digital converter.

10. The method as claimed in claim 2, wherein the correction applied to the current source of the follower stage comprises paralleling with the current source of another current source of fixed value.

11. The method as claimed in claim 3, wherein the correction applied to the current source of the follower stage comprises paralleling with the current source of another current source of fixed value.

12. The method as claimed in claim 2, wherein two capacitors are provided and one of the capacitors is charged by one of the output currents while the other is charged by the other current then the capacitors are discharged by crossing the branches, the capacitors then being placed in series for the purpose of the comparison with the threshold.

13. The method as claimed in claim 3, wherein two capacitors are provided and one of the capacitors is charged by one of the output currents while the other is charged by the other current then the capacitors are discharged by crossing the branches, the capacitors then being placed in series for the purpose of the comparison with the threshold.

14. The method as claimed in claim 4, wherein two capacitors are provided and one of the capacitors is charged by one of the output currents while the other is charged by the other current then the capacitors are discharged by crossing the branches, the capacitors then being placed in series for the purpose of the comparison with the threshold.

15. The integrated circuit as claimed in claim 7, wherein the differential pair is an interleaved pair comprising four differential branches sharing a common charge two by two.

16. The integrated circuit as claimed in claim 15, wherein the interleaved differential pair forms part of a folding cell of a folding circuit in an analog-digital converter.

* * * * *